(12) United States Patent
Ravi

(10) Patent No.: US 6,964,880 B2
(45) Date of Patent: Nov. 15, 2005

(54) METHODS FOR THE CONTROL OF FLATNESS AND ELECTRON MOBILITY OF DIAMOND COATED SILICON AND STRUCTURES FORMED THEREBY

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 10/607,800

(22) Filed: Jun. 27, 2003

(65) Prior Publication Data

US 2004/0266055 A1 Dec. 30, 2004

(51) Int. Cl.[7] .............................................. H01L 21/00
(52) U.S. Cl. ...................................... 438/105; 438/931
(58) Field of Search ................................ 438/105, 110, 438/118, 122, 584, 758, 931

(56) References Cited

U.S. PATENT DOCUMENTS

| | | | |
|---|---|---|---|
| 5,225,926 A | * | 7/1993 | Cuomo et al. ............. 359/350 |
| 5,620,745 A | | 4/1997 | Simpson |
| 5,736,226 A | * | 4/1998 | Tanabe et al. ............. 428/174 |
| 6,051,063 A | | 4/2000 | Tanabe et al. |
| 2002/0140031 A1 | | 10/2002 | RIm |
| 2003/0025198 A1 | | 2/2003 | Chrysler et al. |

FOREIGN PATENT DOCUMENTS

JP 08074056 3/1996

WO WO 02/082514 A1 10/2002

OTHER PUBLICATIONS

Klein C.A. et al., "Chemically vapor-deposited diamond: strains, stresses, and fracture strength", Proceedings of the Fourth International Symposium on Diamond Materials Electrochem, 1995, pp. 661–674, XP009042938, SOC Pennington, NJ, USA.

Invitation To Pay Additional Fees, International App. No.: PCT/US2004/018338, Applicant Ref. No.: P16832PCT, Date Mailed: Feb. 7, 2005, pp.: 5.

Changzhi Gu, et al., "Total–Dose Hardness Integrated Circuit Fabricated with Silicon–On–Diamond Structured Wafer", Diamond and Related Materials, Apr. 1997, pp. 673–675, vol. 6, No. 5–7.

Elsevier Science Publishers, Amsterdam, NL.

"Low–Fluence Laser Patterning of Diamond Films", IBM Technical Disclosure Bulletin, IBM Corp., Apr. 1, 1993, pp. 343–344, vol. 36, No. 4, New York, USA.

* cited by examiner

*Primary Examiner*—Phuc T. Dang
(74) *Attorney, Agent, or Firm*—Kathy J. Ortiz

(57) ABSTRACT

A method of forming a strained silicon device and structures formed thereby is described. That method comprises forming a polysilicon layer on a first and second side of a substantially planar diamond coated silicon wafer, wherein the second side of the substantially planar diamond coated silicon wafer comprises defects, bonding a silicon device layer to a first side of the polysilicon layer, and removing the defects from the second side of the substantially planar diamond coated silicon wafer, wherein a tensile strain in the silicon device layer is induced that increases the electron mobility of the strained silicon device layer.

25 Claims, 15 Drawing Sheets

METHODS FOR THE CONTROL OF FLATNESS AND ELECTRON MOBILITY OF DIAMOND COATED SILICON AND STRUCTURES FORMED THEREBY

FIELD OF THE INVENTION

The present invention relates to the field of semiconductor processing, and more particularly to methods for the control of flatness and electron mobility of diamond coated silicon and structures formed thereby.

BACKGROUND OF THE INVENTION

One goal of microelectronic manufacturing is to increase the number of transistors on a device and thereby increase its operation speed. However, with increased transistor density and speed, power consumption is also increased dramatically. The heat generated from the increased power consumption can raise the microelectronic device temperature dramatically and degrade circuit performance and reliability. Therefore, reducing the overall device operation temperature is of great importance for optimum device performance.

Furthermore, operation of the transistors in a microelectronic device may cause non-uniform heating of the circuit. Certain points on the device may generate more heat than others, thus creating "hot spots". Without such hot spots, it may be possible to increase the average power dissipation of the device while maintaining a desired temperature of the integrated circuit, thus allowing it to operate at a higher frequency.

One way to reduce hot spots is to form a layer of diamond underneath a device substrate, since the high thermal conductivity of diamond enables the diamond layer to spread thermal energy laterally and thus greatly minimize the localized hot spots on the device. However, there are problems associated with forming a diamond layer on a substrate, such as a silicon wafer. One problem with depositing diamond films of sufficient thickness (about 50 to 200 microns) on a silicon wafer (and thereby forming a diamond coated silicon wafer) is that there is a significant difference in the coefficient of thermal expansion (CTE) between silicon and diamond. This difference in CTE can lead to wafer warping, which may preclude further processing or use of the formed diamond coated silicon wafer. This warping can cause either a compressive stress or a tensile stress in the diamond coated silicon wafer depending on the diamond deposition temperature.

However, for example, in the case of a diamond coated silicon wafer in compressive stress after diamond deposition, the warping can be controlled by mechanically and/or chemically introducing defects to a first side of the diamond coated silicon wafer, for example, by the use of a surface roughening process, such as a grinding process. Introducing defects to the first side of the diamond coated silicon wafer induces a tensile stress in the wafer that cancels out any compressive stress induced by the diamond deposition. Thus, by introducing defects to the first side of the diamond coated silicon wafer, the wafer may be "tuned" (i.e., roughened until the stress of the wafer is close to zero) so that a substantially planar (or flat) diamond deposited silicon wafer (i.e., a substantially planar diamond coated silicon wafer) may be obtained. A silicon device layer may then be bonded to a second side of the substantially planar diamond coated silicon wafer, upon which circuit fabrication may be performed.

Such a substantially planar diamond coated silicon wafer may also be utilized after circuit fabrication to increase the mobility of electrons in the silicon device layer, thus increasing the device speed. Removing the defects from the first side of the substantially planar diamond coated silicon wafer by utilizing a polishing process, for example, induces a tensile strain in the silicon device layer. This tensile strain stretches the crystal lattice of the silicon device layer, so that electrons encounter less resistance as they move through the crystal lattice of the silicon device layer. It is well known in the art that electron mobility values in such a strained silicon device layer increase with the introduction of such a tensile strain. Thus, the speed of a microelectronic device can be improved through the use of a strained silicon device layer.

The present invention provides for methods of diamond fabrication and structures formed thereby that improve the flatness and electron mobility of a diamond coated silicon wafer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
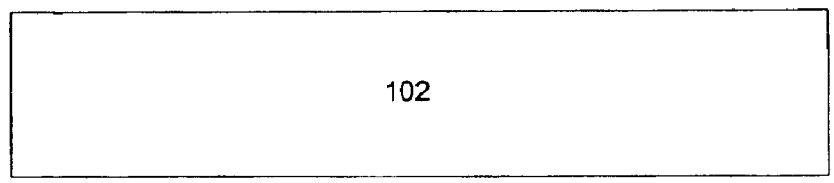
FIGS. 1a–1f represent cross-sections of structures that may be formed when carrying out an embodiment of the method of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a strained silicon device and structures formed thereby are described. Those methods comprise forming a substantially planar diamond coated silicon wafer by forming a diamond layer on a silicon substrate. The diamond layer effects a compressive stress in the silicon substrate upon formation. Then, a first surface of the formed diamond coated silicon wafer is roughened, which introduces defects into the first surface that induce a tensile stress in the silicon substrate. The roughened induced tensile stress neutralizes the formation induced compressive stress so that a substantially planar diamond coated silicon wafer may be formed. Thereafter, a strained silicon device may be formed on the substantially planar diamond coated silicon wafer, by first forming a first polysilicon layer on a first side of the substantially planar diamond coated silicon wafer, and a second polysilicon layer on a second side of the substantially planar diamond coated silicon wafer. Next, a silicon device layer is bonded to the second polysilicon layer. Then, the defects from the first side of the substantially planar diamond coated silicon wafer are removed, wherein a tensile strain is induced in the silicon device layer. This tensile strain increases the electron mobility of the silicon device layer.

Figure 1B:
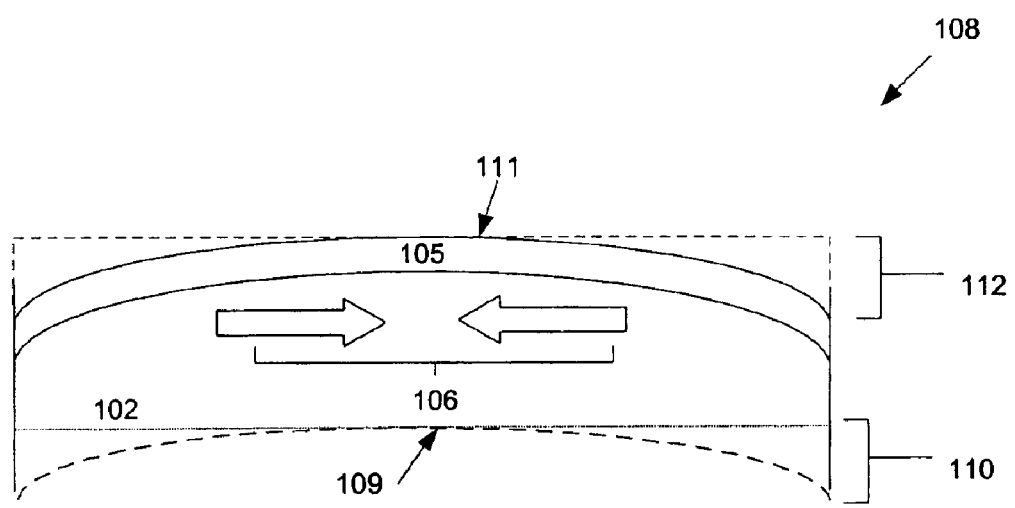

In one embodiment of the method of the present invention, as illustrated by FIGS. 1a–1f, a diamond layer 105 may be formed on a silicon substrate 102 to form a diamond coated silicon wafer 108 (FIG. 1a-1b). The diamond layer 105 may be formed on the silicon substrate 102 utilizing conventional methods suitable for the deposition of diamond films known in the art, such as plasma enhanced chemical vapor deposition ("PECVD"). The thickness of the diamond layer 105 may be from about 20 to 200 microns in thickness, with a thickness above 100 microns preferred.

Figure 1C:
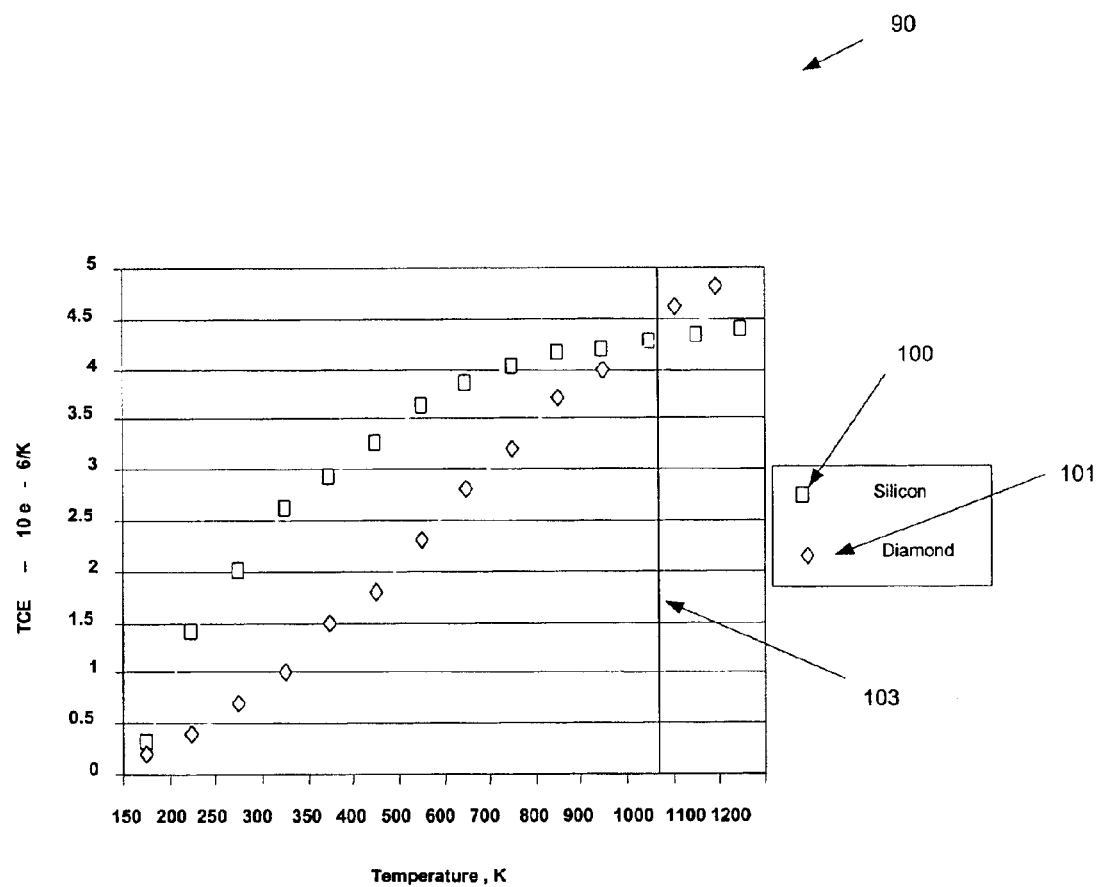

Referring to FIG. 1c, a graph 90 represents a set of temperature data, wherein the coefficients of thermal expansion (CTE) are depicted for both silicon and diamond. It can be determined from graph 90 that the silicon and diamond CTE temperature values "cross" each other at a point on the graph 90. This crossover point is known by those skilled in the art as a CTE crossover temperature 103. For example, referring to graph 90, the CTE crossover temperature 103 (i.e., the point on the graph 90 where the silicon CTE 100 crosses over the diamond CTE 101) is approximately 1050 degrees Celsius. A CTE crossover temperature for a specific silicon substrate and a specific diamond layer may be empirically determined, as is well known in the art. Thus, the diamond deposition temperature should be chosen so that it is below the CTE crossover temperature 103. Additionally, the temperature gradient across the silicon substrate 102 should also be controlled during the deposition to be within about +/−25 degrees of the CTE crossover temperature 103.

In the current embodiment, a preferred diamond deposition process temperature is in a range of about 800 to 850 degrees Celsius. In this temperature range, which is below the CTE crossover temperature 103 for the silicon substrate 102 and the diamond layer 105, the diamond layer 105 induces a compressive stress 106 in the silicon substrate 102 upon deposition onto the silicon substrate 102 (See FIG. 1b). The compressive stress 106 causes a concave bow in the diamond coated silicon wafer 108 upon formation of the diamond coated silicon wafer 108. The diamond coated silicon wafer 108 exhibits a first surface first deflection 110 in a first surface 109 of the diamond coated silicon wafer 108, and a second surface first deflection 112 in a second surface 111 of the diamond coated silicon wafer 108, due to the compressive stress 106 (see FIG. 1b). The first surface first deflection 110 in the first surface 109 and the second surface first deflection 112 in the second surface 111 are equal in magnitude to each other. The magnitude of the first surface first deflection 110 and the second surface first deflection 112 may range from approximately 20 microns to more than 230 microns, depending on the diamond deposition parameters.

Following the formation of the diamond coated silicon wafer 108, the first surface 109 of the diamond coated silicon wafer 108 may be roughened by a physical and/or chemically process, such as a grinding process as is well known in the art. For example, the first surface 109 may be roughened by the use of a grinder 113, which applies a grinding process, such as a chemical mechanical polisher (CMP) as is well known in the art, to the first surface 109 of the diamond coated silicon wafer 108. It is to be understood by those skilled in the art that the grinder 113 may include those grinding tools which physically and/or chemically roughen, i.e., introduce defects (depicted as the defects 114 in FIG. 1d) in the first surface 109 of the diamond coated silicon wafer 108. Such defects 114 may include microcracks, dislocations and/or a plastically deformed surface. The grinder 113 may induce a tensile stress 115 that may cause a convex bow in the diamond coated silicon wafer 108. The tensile stress 115 caused by the grinder 113 may effect a decrease in the magnitude of the first surface first deflection 110 and the second surface first deflection 112. In this manner, the tensile stress 115 may decrease the original amount of diamond coated silicon wafer 108 bow due to the deposition of the diamond layer 105 on the silicon substrate 102, since the tensile stress 115 cancels out the compressive stress 106 in a manner that is well known in the art. This canceling out of the compressive stress 106 by the tensile stress 115 enables the capability of "tuning" the planarity of the diamond coated silicon wafer 108. The ability to tune the planarity, or flatness, of the diamond coated silicon wafer 108 improves the ability to process a substantially planar diamond coated silicon wafers, such as the diamond coated silicon wafer 108, since the planarity of the diamond coated silicon wafer can be adjusted after deposition to account for flatness variations that may occur during wafer processing.

Figure 1D:
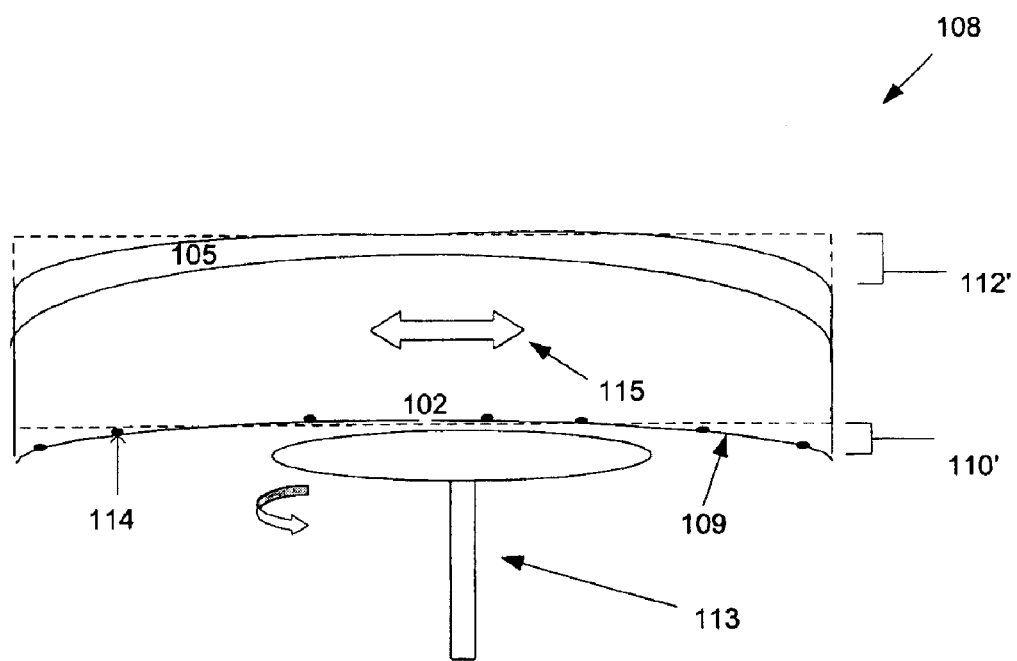
Figure 1E:
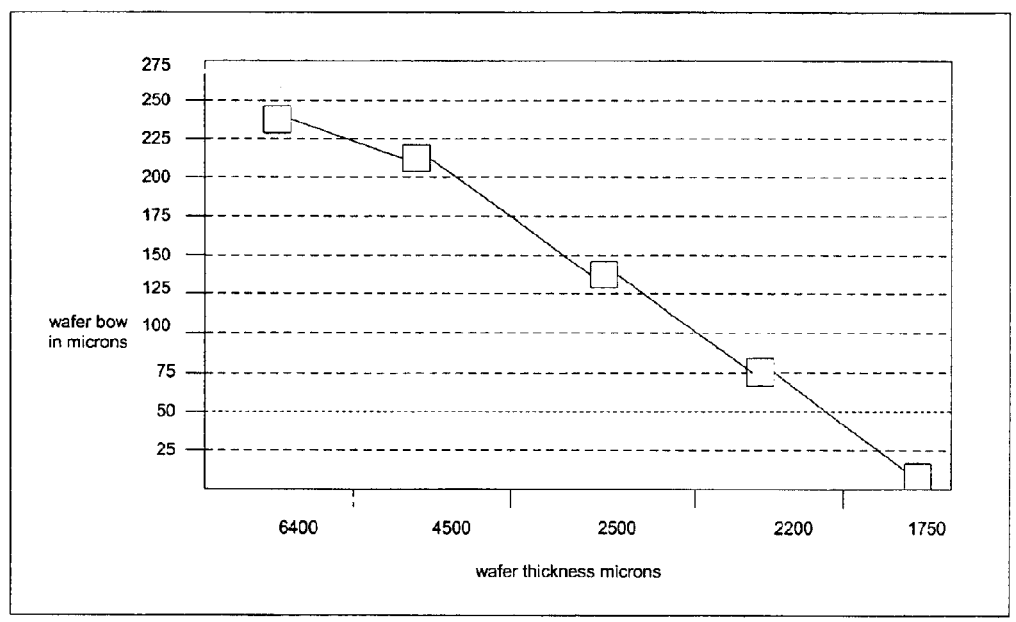
Figure 1F:
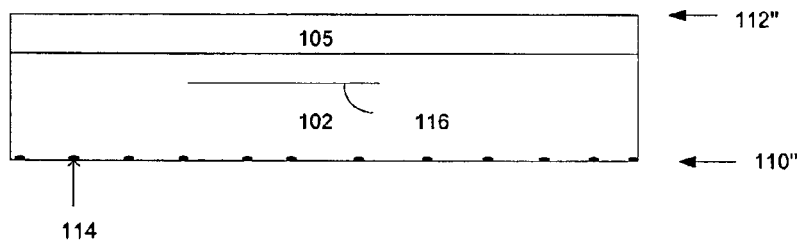

A first surface second deflection 110' and second surface second deflection 112' in FIG. 1d represent intermediate magnitudes of deflection of the diamond coated silicon wafer 108 as it is roughened by the grinder 113, which are lower in magnitude than the first surface first deflection 110 and the second surface first deflection 112. The amount of time the grinding process 113 is applied to the first surface 109 of the diamond coated silicon wafer 108 will depend on the first surface first deflection 110 and second surface first deflection 112, (which is the initial amount of bow in the wafer caused by the diamond deposition), and a desired first surface final deflection 110" and a second surface final deflection 112" of the diamond coated silicon wafer 108 (see FIG. 1f). For example, referring to the graph 91 depicted in FIG. 1e, by roughening the first surface 109 of the diamond coated silicon wafer 108, (for example through the use of the grinder 113), the diamond coated silicon wafer 108 of this example may exhibit a reduction in bow. This reduction in bow corresponds to a reduction in the first surface first deflection 110 and the second surface first deflection 112 (shown in FIG. 1b) from about 230 microns to about 15 microns, which may remove approximately 4.7 microns of the silicon substrate 102 from the first surface 109 of the diamond coated silicon wafer 108. In this manner, magnitudes of 15 microns (which represent a substantially planar diamond coated silicon wafer) for both the first surface final deflection 110" and the second surface final deflection 112"

may be achieved according to the current embodiment of the present invention. Thus, the method of the present invention enables the tuning of the planarity of the diamond coated silicon wafer 108 to achieve the desired first surface final deflection level 110" and second surface final deflection level 112". As is shown in FIG. 1f, the magnitudes of the first surface final deflection 110" and the second surface final deflection 112" may be approximately zero after being roughened (by the application of the grinder 113, for example), thus forming a flatness-tuned diamond coated silicon wafer 119. The approximately zero magnitudes of the first surface final deflection 110" and the second surface final deflection 112" correspond to an approximately zero stress level 116 in the flatness-tuned diamond coated silicon wafer 119.

As previously described, an advantage of tuning the planarity of the diamond coated silicon wafer 108 according to the method of the present embodiment is that a greater process window may be achieved with which to tailor the flatness of the diamond coated silicon wafer 108 after diamond deposition. A further advantage is that the thinning of the diamond coated silicon wafer 108 through the use of the grinder 113 to roughen the first surface 109 of the diamond coated silicon wafer 108 compensates for the additional thickness added to the diamond coated silicon wafer 108 by the deposition of the diamond layer 105.

Figure 5A:
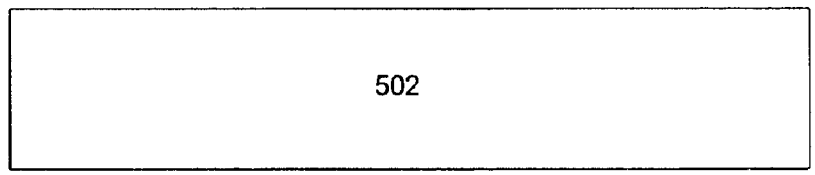
FIGS. 5a–5d represent cross-sections of a structure that may be formed when carrying out another embodiment of the method of the present invention.
Figure 5B:
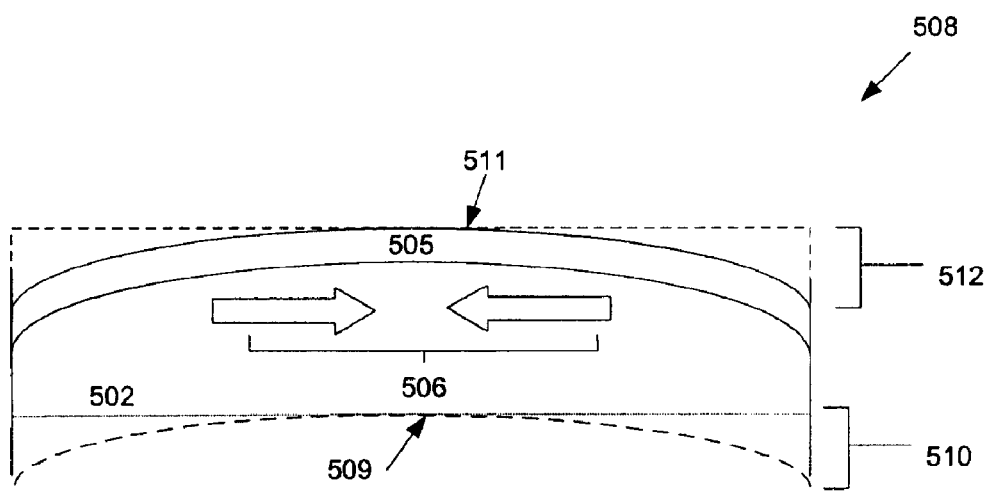

In another embodiment of the present invention, as shown in FIGS. 5a–5d, a diamond layer 505 (similar to diamond layer 105) may be formed on a silicon substrate 502 to form a diamond coated silicon wafer 508 (FIG. 5a-5b). In the current embodiment, a preferred diamond deposition process temperature is in a range of about 800 to 850 degrees Celsius, which is below the CTE crossover temperature (as discussed previously) for the silicon substrate 502 and the diamond layer 505. In this temperature range, the diamond layer 505 induces a compressive stress 506 (similar to the compressive stress 106) in the silicon substrate 502 upon deposition onto the silicon substrate 502. The compressive stress 506 causes a concave bow in the diamond coated silicon wafer 508 upon formation of the diamond coated silicon wafer 508. The diamond coated silicon wafer 508 exhibits a first surface first deflection 510 in a first surface 509 of the diamond coated silicon wafer 508, and a second surface first deflection 512 in a second surface 511 of the diamond coated silicon wafer 508 (similar to the first surface first deflection 110 in the first surface 109 and the second surface first deflection 112 in the second surface 111 previously discussed), due to the compressive stress 506 (see FIG. 5b).

Following the formation of the diamond coated silicon wafer 508, a polysilicon layer (shown in FIG. 5c as a first polysilicon layer 520 and a second polysilicon layer 520') may be formed on either the first surface 509 and/or the second surface 511 of the diamond coated silicon wafer 508. The polysilicon layer 520, 520' may induce a tensile stress 515 in the diamond coated silicon wafer 508. The tensile stress 515 may effect a decrease in the magnitude of the first surface first deflection 510 and the second surface first deflection 512. In this manner, the tensile stress 515 may decrease the original amount of diamond coated silicon wafer 508 bow due to the deposition of the diamond layer 505 on the silicon substrate 502, since the tensile stress 515 cancels out the compressive stress 506 in a manner that is well known in the art. This canceling out of the compressive stress 506 by the tensile stress 515 enables the capability of "tuning" the planarity of the diamond coated silicon wafer 508 by forming the polysilicon layer 520, 520' on either or both sides of the diamond coated silicon wafer 508. The planarity of the diamond coated silicon wafer 508 can therefore be adjusted after diamond deposition to account for flatness variations that may occur during wafer processing.

Figure 5C:
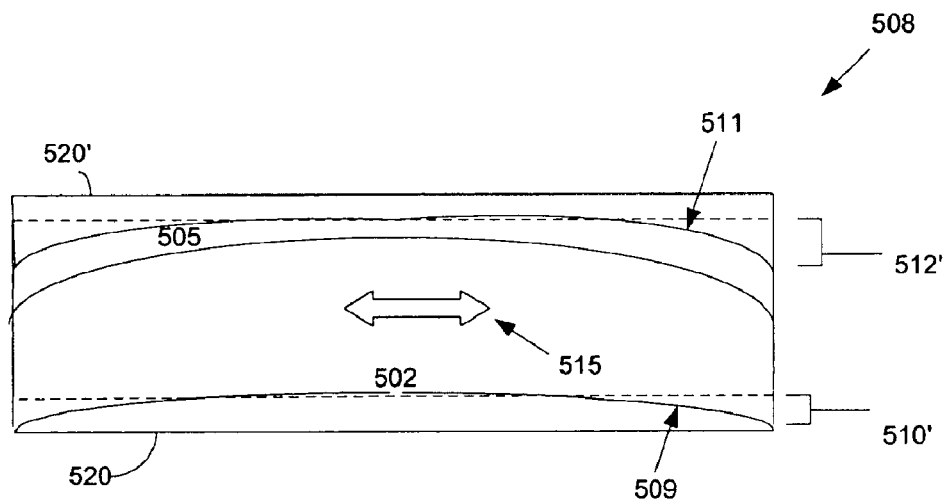
Figure 5D:
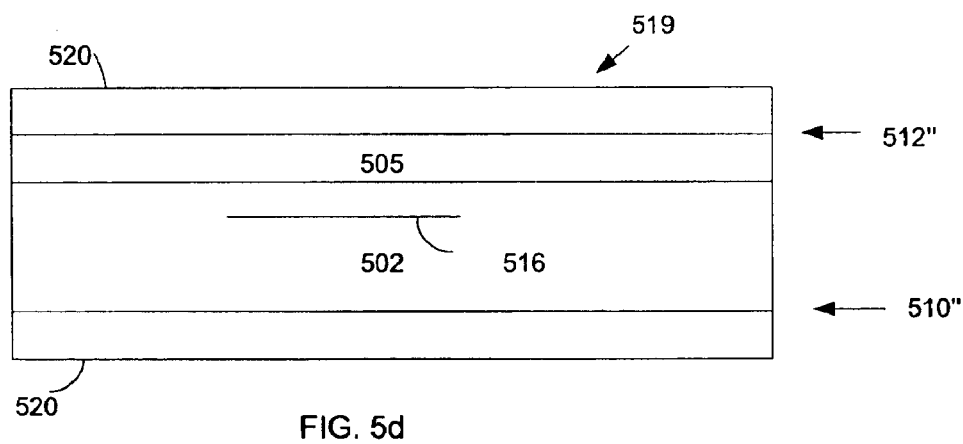

A first surface second deflection 510' and second surface second deflection 512' shown in FIG. 5c represent intermediate magnitudes of deflection of the diamond coated silicon wafer 508 which are lower in magnitude than the first surface first deflection 510 and the second surface first deflection 512, as a result of the formation of the polysilicon layer 520, 520' on the first surface 509 and second surface 511 of the diamond coated silicon wafer 508 respectively. The amount of polysilicon formed on the either the first surface 509 and/or the second surface 511 of the diamond coated silicon wafer 508 will depend on the first surface first deflection 510 and second surface first deflection 512, (which is the initial amount of bow in the wafer caused by the diamond deposition), and a desired first surface final deflection 510" and a second surface final deflection 512" of the diamond coated silicon wafer 508 (see FIG. 5d). Thus, the method of the current embodiment enables the tuning of the planarity of the diamond coated silicon wafer 508 to achieve the desired first surface final deflection level 510" and second surface final deflection level 512". As is shown in FIG. 5d, the magnitudes of the first surface final deflection 510" and the second surface final deflection 512" may be approximately zero after formation of the polysilicon layer 520, 520', thus forming a flatness-tuned diamond coated silicon wafer 519. The approximately zero magnitudes of the first surface final deflection 510" and the second surface final deflection 512" correspond to an approximately zero stress level 516 in the flatness-tuned diamond coated silicon wafer 519.

In a further embodiment of the present invention, referring back to FIGS. 2a–2f, a diamond layer 205 (similar to diamond layer 105) may be formed on a silicon substrate 202 (similar to silicon substrate 102) to form a diamond coated silicon wafer that may be tuned (according to the embodiment described in FIGS. 1a–1f) to form a flatness tuned diamond coated silicon wafer 219.

Figure 2A:
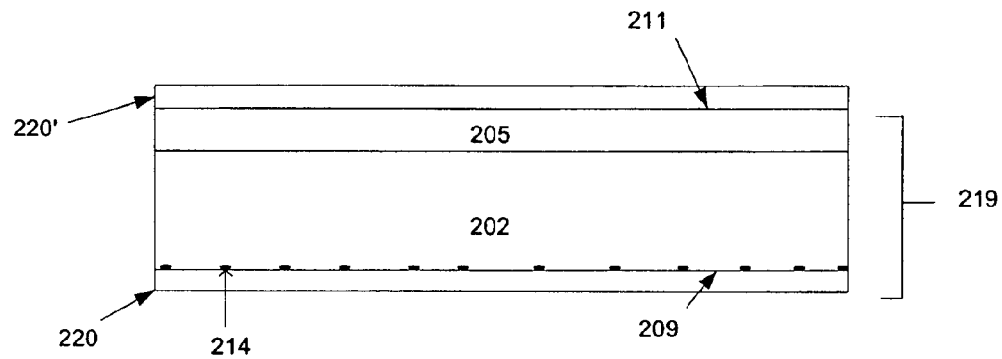
FIGS. 2a–2f represent cross-sections of a structure that may be formed when carrying out another embodiment of the method of the present invention.
Figure 2B:
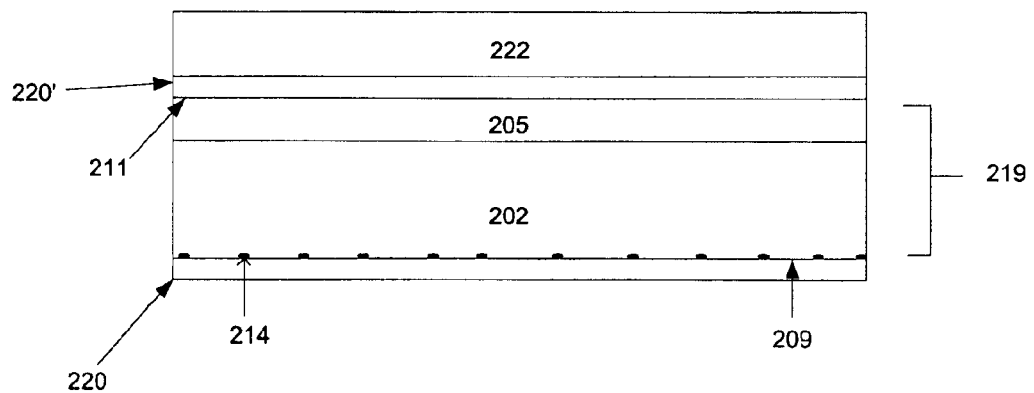
Figure 2C:
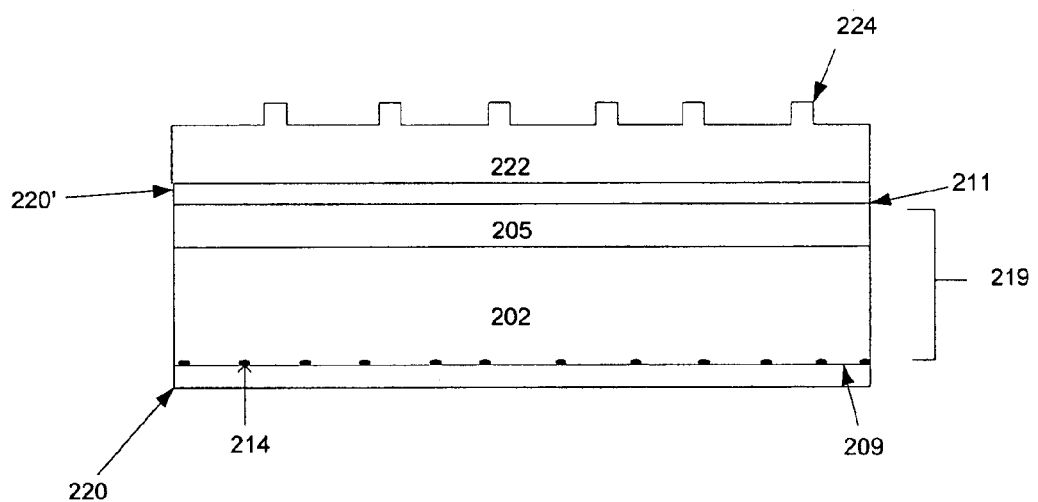

Referring to FIG. 2a, a first polysilicon layer 220 may be formed on a first surface 209 of the flatness-tuned diamond coated silicon wafer 219, and a second polysilicon layer 220' may be formed on a second surface 211 of the flatness-tuned diamond coated silicon wafer 219 (see FIG. 2a). The first surface 209 of the flatness-tuned diamond coated silicon wafer 219 may comprise defects 214, similar to the defects 114 previously described. The first polysilicon layer 220 and the second polysilicon layer 220' may preferably be deposited by chemical vapor deposition (CVD), or may be deposited by other such deposition methods as are known in the art. The first polysilicon layer 220 and the second polysilicon layer 220' may then be polished using polishing methods known to those skilled in the art. The polishing provides a smooth surface which acts as a type of "glue" with which to bond a silicon device layer 222 (such as a single crystal silicon wafer, for example) to the second polysilicon layer 220' (see FIG. 2b). The silicon device layer 222 may be bonded to the second polysilicon layer 220' by a variety of methods. Those methods may include a layer transfer method, in which a hydrogen implanted silicon device layer, such as the silicon device layer 222, is bonded to a polysilicon layer, such as the second polysilicon layer 220', using bonding methods well known in the art. Then, the implanted silicon device layer is cleaved at the implanted region leaving behind a thin single device layer 222 on the second polysilicon device layer 220.

Figure 4A:
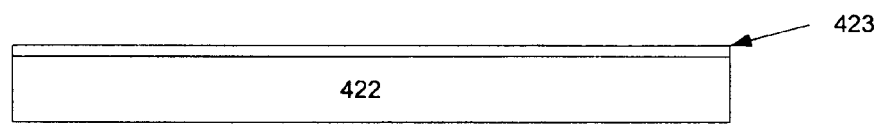
FIGS. 4a–4b represent cross-sections of a structure that may be formed when carrying out another embodiment of the method of the present invention.
Figure 4B:
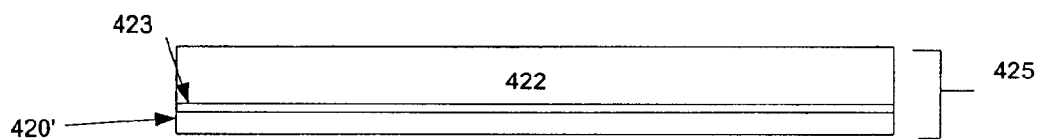

Another method of bonding the silicon device layer 222 to the second polysilicon layer 220' is by utilizing the technique of bonding and polishing back, in which a silicon device layer, such as silicon device layer 222, is bonded to the second polysilicon layer 220' and the then silicon device layer 222 is polished to the desired thickness. In yet another embodiment, shown in FIG. 4a-4b, a silicon device layer 422 (similar to silicon device layer 222) may be oxidized to form a dielectric layer 423 on the silicon device layer 422 prior to bonding the silicon device layer 422 to the second polysilicon layer 420' (similar to the second polysilicon layer 220'). Upon bonding the dielectric layer 423 (formed on the silicon device layer 422) to the second polysilicon layer 420' (FIG. 4b), a silicon on insulator (SOI) structure 425 may be formed. The SOI structure 425 may comprise the second polysilicon layer 420', (disposed on a silicon substrate, such as silicon substrate 205, not shown), the dielectric layer 423 and the silicon device layer 422.

Figure 2D:
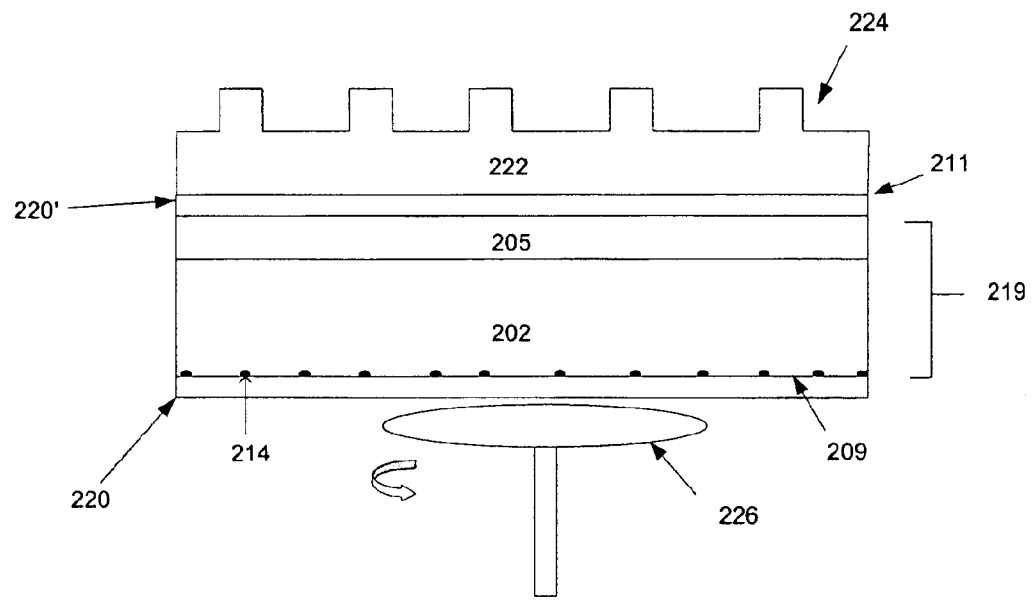
Figure 2E:
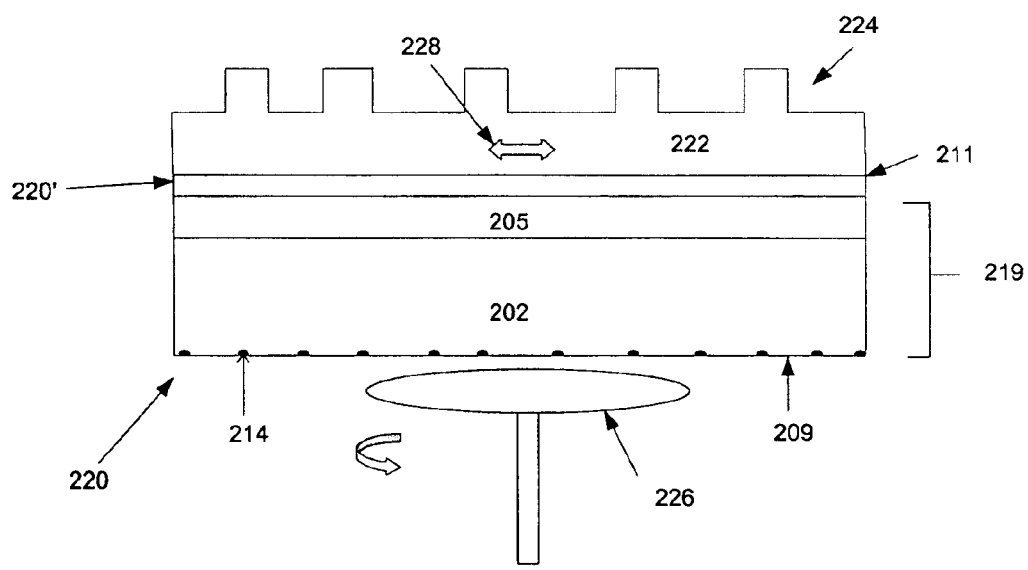

Referring back to FIG. 2c, a plurality of circuit elements 224 may be formed in and/or on the bonded silicon device layer 222. The plurality of circuit elements 224 may include such circuit elements as transistors, capacitors, diodes, etc. and may be formed in manners well known in the art. Following formation of the plurality of circuit elements 224 on/in the silicon device layer 222, the first polysilicon layer 220 may be removed from the first surface 209 of the flatness-tuned diamond coated silicon wafer 219. The first polysilicon layer 220 may be removed by applying a polishing process, such as a CMP polishing process, which utilizes a polisher 226 (FIG. 2d). The defects 214 may then be removed from the first surface 209 of the flatness-tuned diamond coated silicon wafer 219 (FIG. 2e) by the application of the polishing process to the first surface 209 of the flatness-tuned diamond coated silicon wafer 219.

Figure 2F:
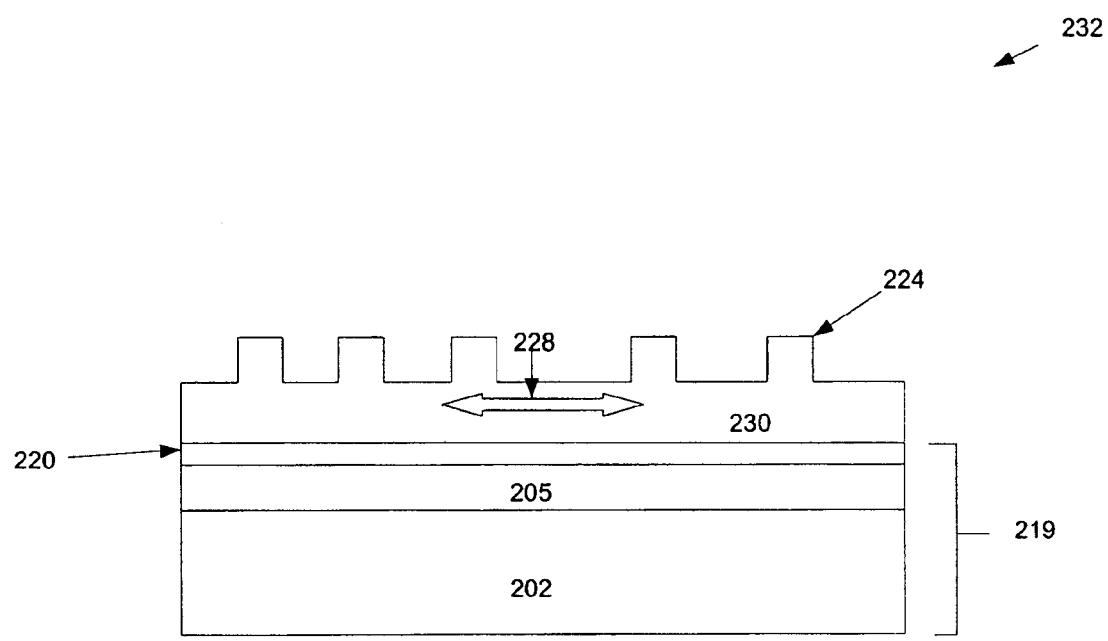

Upon removal of the defects 214 from the first surface 209 of the flatness-tuned diamond coated silicon wafer 219, a tensile strain 228 is induced in the silicon device layer 222 of the flatness-tuned diamond coated silicon wafer 219 and in this manner a strained silicon device layer 230 is formed (see FIG. 2f). The tensile strain 228 may be a biaxial tensile strain. The tensile strain 228 stretches the crystal lattice of the strained silicon device layer 230, so that electrons encounter less resistance as they move through the crystal lattice of the silicon device layer 222. It is well known in the art that electron mobility values in such a strained silicon device layer, such as the strained silicon device layer 230, may increase with the introduction of a tensile strain in the silicon device layer. The electron mobility may increase for example, from 1600 cm$^2$/Vs to about 2300 cm$^2$/Vs for a 1% tensile strain in a the strained silicon device layer 230. The tensile strain 228 in the strained silicon device layer 230 of the present invention may range from about 0.8% to over 10%. Thus, a strained silicon device 232 (FIG. 2f) that is formed according to the methods of the present invention will exhibit greatly enhance electron mobility, and consequently the speed of the strained silicon device 232 will be greatly increased. In addition, the strained silicon device 232 also has improved thermal management capabilities due to the high thermal conductivity of the diamond layer. The presence of the diamond layer 205 beneath the strained silicon device layer 230 has the additional important advantage of spreading heat from hot spots in the circuit during device operation due to the exceptional thermal conductivity of the diamond layer 205.

Figure 6A:
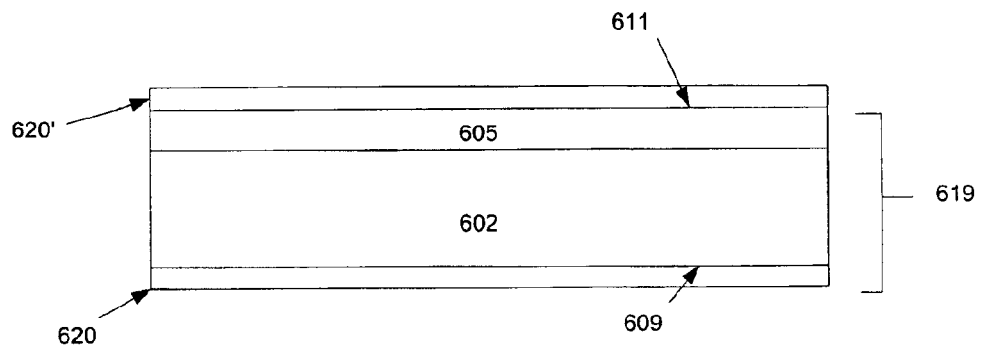
FIGS. 6a–6e represent cross-sections of a structure that may be formed when carrying out another embodiment of the method of the present invention.
Figure 6B:
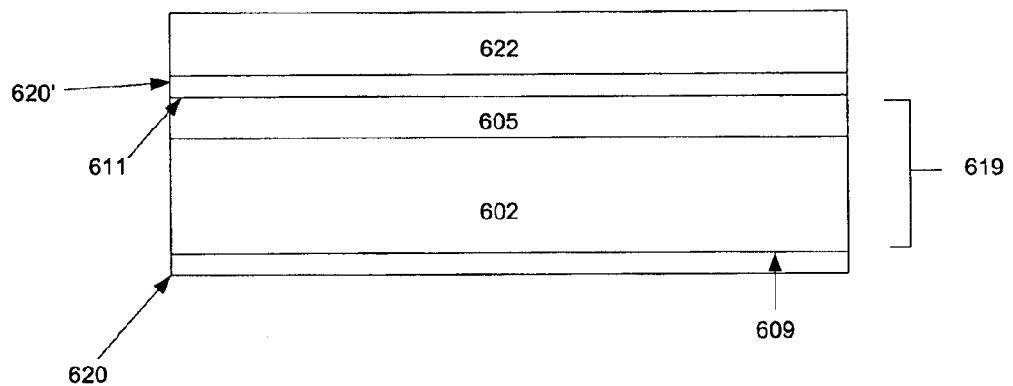

In yet another embodiment of the present invention, as shown in FIGS. 6a-6e, a flatness-tuned diamond coated silicon wafer 619 may comprise a diamond layer 605 (similar to diamond layer 505) disposed on a silicon substrate 602 (similar to silicon substrate 502, see FIG. 6a). The flatness tuned diamond coated silicon wafer may further comprise a first polysilicon layer 620 disposed on a first surface 609 of the flatness-tuned diamond coated silicon wafer 619, and a second polysilicon layer 620' disposed on a second surface 611. The flatness tuned diamond coated silicon wafer 619 may be tuned according to the method of the embodiment described in FIGS. 5a-5f.

The first polysilicon layer 620 and the second polysilicon layer 620' may then be polished using polishing methods known to those skilled in the art. The polishing provides a smooth surface which acts as a type of "glue" with which to bond a silicon device layer 622 (such as a single crystal silicon wafer, for example) to the second polysilicon layer 620' (see FIG. 6b). The silicon device layer 622 may be oxidized to form a SOI structure with the second polysilicon layer 620', similar to the SOI structure 425 as previously described (not shown). The silicon device layer 622 may then be bonded to the second polysilicon layer 620' by a variety of methods, such as by layer transfer or by the technique of bonding and polishing back, as described previously herein.

Figure 6C:
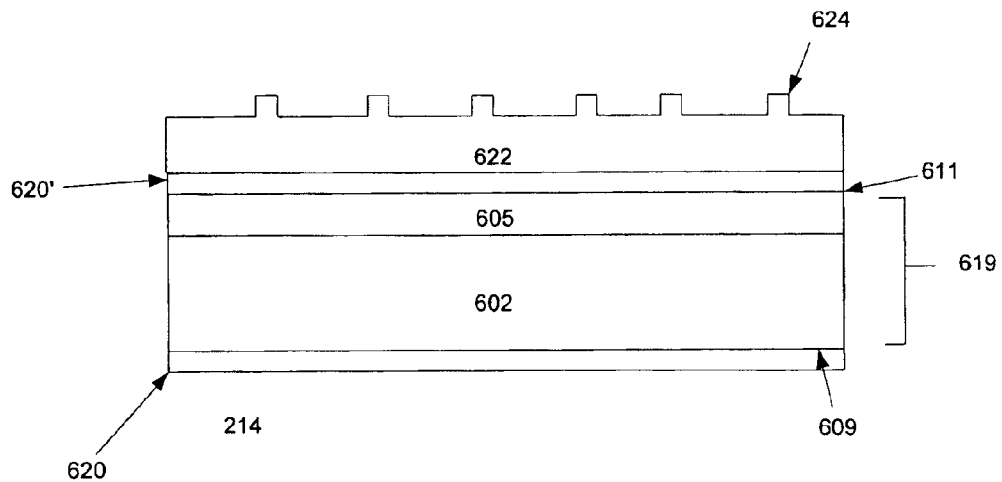
Figure 6D:
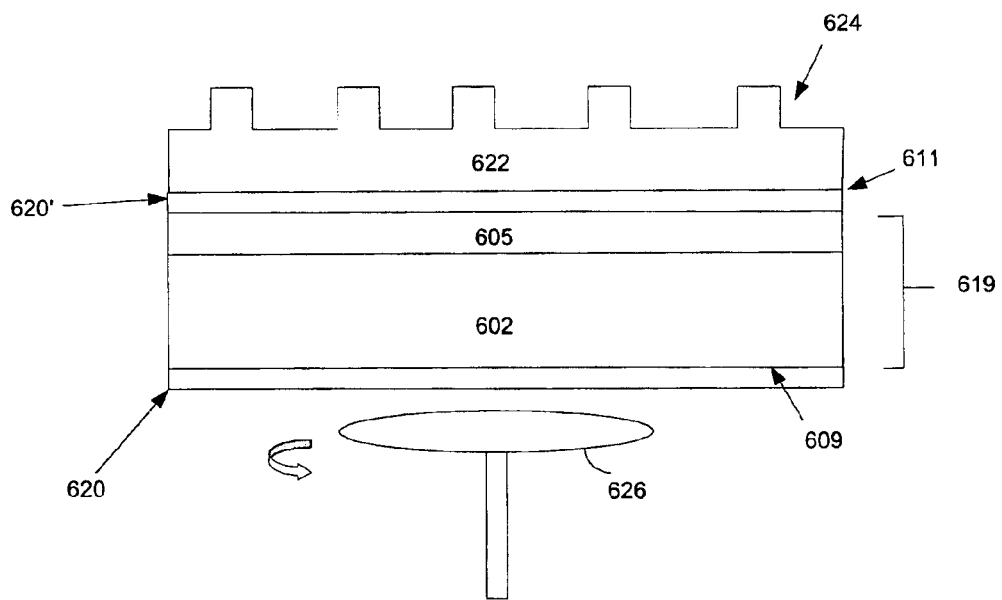
Figure 6E:
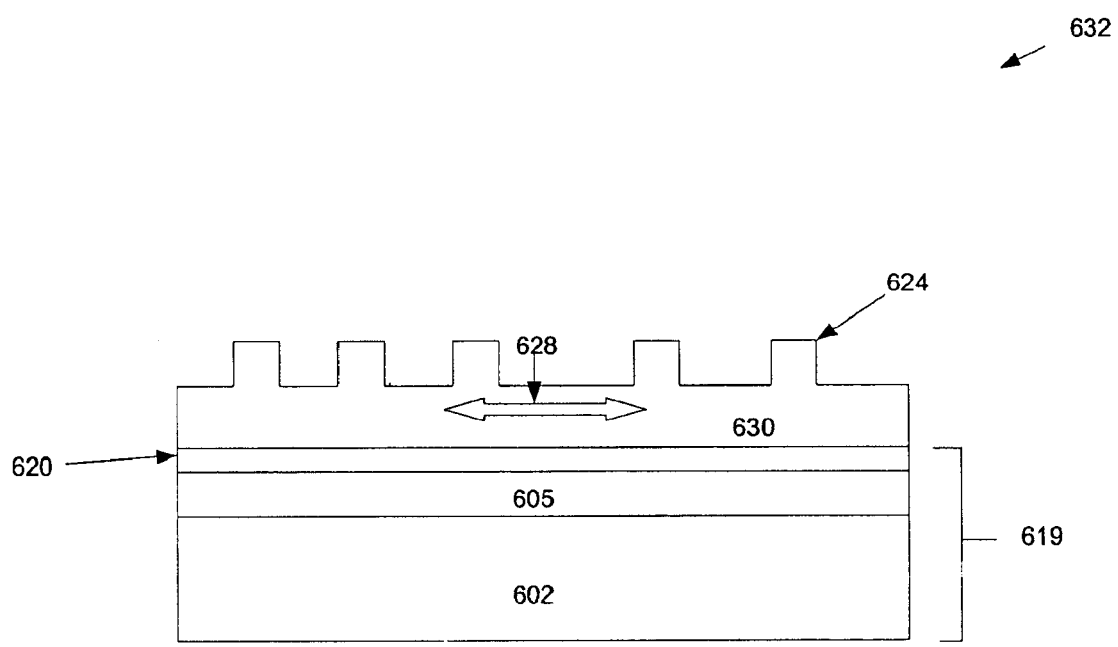

Referring to FIG. 6c, a plurality of circuit elements 624 may be formed in and/or on the bonded silicon device layer 622 (FIG. 6c). The plurality of circuit elements 624 may include such circuit elements as transistors, capacitors, diodes, etc. and may be formed in manners well known in the art. Following formation of the plurality of circuit elements 624 on/in the silicon device layer 622, the first polysilicon layer 620 may be removed from the first surface 609 of the flatness-tuned diamond coated silicon wafer 619. The first polysilicon layer 620 may be substantially removed by applying a polishing process, such as a CMP polishing process, which utilizes a polisher 626 (FIG. 6d).

Upon substantially removing the first polysilicon layer 620 from the first surface 609 of the flatness-tuned diamond coated silicon wafer 619, a tensile strain 628 is induced in the silicon device layer 622 of the flatness-tuned diamond coated silicon wafer 619 (see FIG. 6e), and in this manner a strained silicon device layer 630 (similar to strained silicon device layer 230) is formed. The tensile strain 628 may be a biaxial tensile strain. The tensile strain 628 stretches the crystal lattice of the strained silicon device layer 630, so that electron mobility values in the strained silicon device layer 630 are increased, similar to the strained silicon device layer 230. The tensile strain 628 in the strained silicon device layer 630 of the present invention may range from about 0.8% to over 10%. Thus, a strained silicon device 632 (similar to strained silicon device 230) that is formed according to the methods of the present invention will exhibit greatly enhance electron mobility, and consequently the speed of the strained silicon device 632 will be greatly increased. In addition, the strained silicon device 632 also has improved thermal management capabilities due to the high thermal conductivity of the diamond layer. The presence of the diamond layer 605 beneath the strained silicon device layer 230 has the additional important advantage of spreading heat from hot spots in the circuit during device operation due to the exceptional thermal conductivity of the diamond layer 605.

Figure 3:
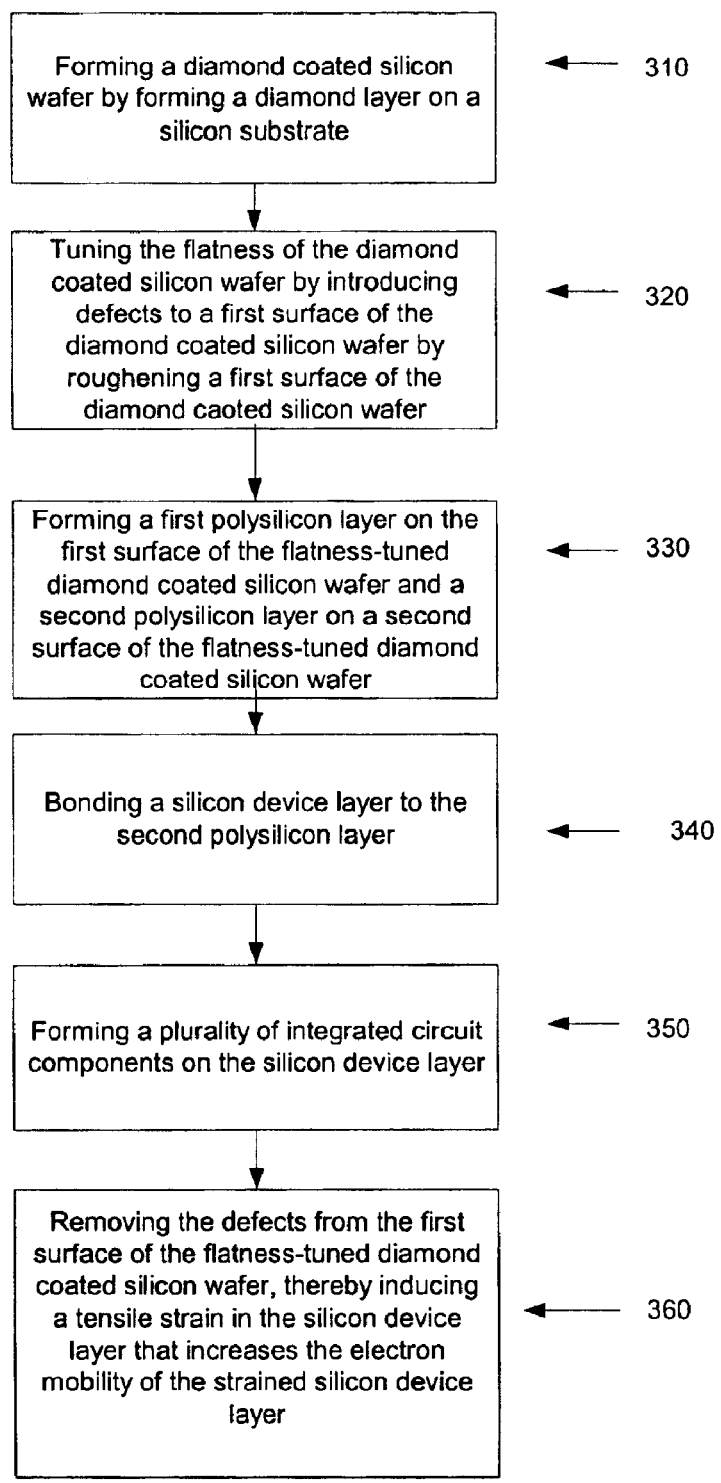
FIG. 3 is a flow chart of an embodiment of the method of the present invention.

FIG. 3 depicts a flowchart for forming a strained silicon device according to an embodiment of the present invention. First, as shown in step 310, a diamond coated silicon wafer is formed by forming a diamond layer on a silicon substrate. Next, as shown in step 320, the flatness of the diamond coated silicon wafer is tuned by introducing defects to a first surface of the diamond coated silicon wafer by roughening a first surface of the diamond coated silicon wafer. Then, as shown in step 330, a first polysilicon layer is formed on the first surface of the flatness-tuned diamond coated silicon wafer and a second polysilicon layer is formed on a second surface of the flatness-tuned diamond coated silicon wafer. Then, as shown in step 340, a silicon device layer is bonded to the second polysilicon layer. Next, as shown in step 350, a plurality of integrated circuit components are formed on the silicon device layer. Finally, as shown in step 360, the defects are removed from the first surface of the flatness-tuned diamond coated silicon wafer, thereby inducing a tensile strain in the silicon device layer that increases the electron mobility of the strained silicon device layer.

As described above, the present invention provides methods and structures formed thereby of forming a strained silicon device on a flatness-tuned diamond coated silicon wafer in order to improve the electron mobility, speed and thermal management capabilities of a silicon device. Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a silicon device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming a substantially planar diamond coated silicon wafer comprising:
    forming a diamond coated silicon wafer comprising forming a diamond layer on a silicon substrate that induces a compressive stress in the silicon substrate, wherein the diamond layer is formed at a temperature below a CTE crossover temperature; and
    tuning the planarity of the diamond coated silicon wafer by roughening a first surface of the diamond coated silicon wafer.

2. The method of claim 1 wherein roughening the first surface of the diamond coated silicon wafer induces a tensile stress that cancels the compressive stress in the silicon substrate.

3. The method of claim 1 wherein tuning the planarity of the diamond coated silicon wafer comprises decreasing the magnitude of a first surface first deflection and a second surface first deflection in the diamond coated silicon wafer.

4. The method of claim 1 wherein the diamond layer is formed at a temperature below a CTE crossover temperature comprises forming the diamond layer from about 600 degrees Celsius to about 1100 degrees Celsius.

5. The method of claim 1 wherein forming the diamond layer comprises forming the diamond layer by PECVD.

6. The method of claim 5 wherein forming the diamond layer by PECVD comprises applying a temperature gradient across the silicon substrate that is within about 50 degrees of the CTE crossover temperature.

7. The method of claim 1 wherein roughening the first surface of the diamond coated silicon wafer comprises grinding.

8. The method of claim 1 wherein roughening the first surface of the diamond coated silicon wafer comprises introducing defects in the first surface of the diamond coated silicon wafer.

9. A method of forming a substantially planar diamond coated silicon wafer comprising:
    forming a diamond coated silicon wafer comprising forming a diamond layer on a silicon substrate that induces a compressive stress in the silicon substrate; and
    tuning the planarity of the diamond coated silicon wafer by forming a first polysilicon layer on a first surface of the diamond coated silicon wafer.

10. The method of claim 9 wherein forming the first polysilicon layer on the first surface of the diamond coated silicon wafer induces a tensile stress that cancels the compressive stress in the silicon substrate.

11. The method of claim 9 wherein tuning the planarity of the diamond coated silicon wafer comprises decreasing the magnitude of a first surface first deflection and a second surface first deflection in the diamond coated silicon wafer.

12. The method of claim 9 wherein tuning the planarity of the diamond coated silicon wafer further comprises forming a second polysilicon layer on a second surface of the diamond coated silicon wafer.

13. The method of claim 12 wherein forming the first polysilicon layer and the second polysilicon layer comprises forming the first polysilicon layer and the second polysilicon layer by PECVD.

14. A method of forming a strained silicon device comprising:
    providing a flatness tuned diamond coated silicon wafer wherein a first surface of the flatness-tuned diamond coated silicon wafer comprises defects;
    forming a first polysilicon layer on a first surface of the flatness-tuned diamond coated silicon wafer and a second polysilicon layer on a second surface of the flatness-tuned diamond coated silicon wafer,
    bonding a silicon device layer to the second polysilicon layer;
    forming a plurality of circuit components on the silicon device layer; and
    substantially removing the defects from the first surface of the flatness-tuned diamond coated silicon wafer to induce a tensile strain in the silicon device layer.

15. The method of claim 14 wherein substantially removing the defects from the first surface of the flatness-tuned diamond coated silicon wafer comprises;
    removing the first polysilicon layer; and
    substantially removing the defects from the first surface of the flatness-tuned diamond coated silicon wafer.

16. The method of claim 14 wherein bonding the silicon device layer comprises bonding the silicon device layer to the second polysilicon layer and polishing the bonded silicon device layer to the desired thickness.

17. The method of claim 14 wherein bonding the silicon device layer comprises bonding an oxidized silicon device layer to the second polysilicon layer, wherein a SOI structure is formed.

18. The method of claim 14 wherein bonding the silicon device layer
    comprises bonding the silicon device layer to the second polysilicon layer by layer transfer.

19. The method of claim 14 wherein forming the flatness tuned diamond coated silicon wafer comprises forming a substantially zero stress flatness-tuned diamond coated silicon wafer.

20. A method of forming a strained silicon device comprising:
- providing a flatness tuned diamond coated silicon wafer comprising a first polysilicon layer disposed on a first surface of the flatness tuned diamond coated silicon wafer and a second polysilicon layer on a second surface of the flatness tuned diamond coated silicon wafer;
- bonding a silicon device layer to the second polysilicon layer;
- forming a plurality of circuit components on the silicon device layer; and
- substantially removing the first polysilicon layer from the first surface of the flatness tuned diamond coated silicon wafer to induce a tensile strain in the silicon device layer.

21. The method of claim 20 wherein providing the flatness tuned diamond coated silicon wafer comprises providing a substantially zero stress flatness tuned diamond coated silicon wafer.

22. A microelectronic structure, comprising:
- a diamond layer on a silicon substrate; and
- a strained silicon device layer on the diamond layer, wherein the strained silicon device layer comprises a tensile strain greater than about 1 percent.

23. The structure of claim 22 wherein the strained silicon device layer comprises a plurality of circuit components.

24. The structure of claim 22 wherein the strained silicon device layer comprises a silicon on insulator (SOI) structure.

25. The structure of claim 22 wherein the diamond layer is between about 25 and 200 microns thick.

* * * * *